(12) United States Patent
Regimbal et al.

(10) Patent No.: US 8,054,632 B2
(45) Date of Patent: Nov. 8, 2011

(54) METHOD AND APPARATUS FOR MOUNTING SERVER BLADES IN A BLADE CHASSIS

(75) Inventors: Laurent A. Regimbal, Round Rock, TX (US); Brandon J. Brocklesby, Pflugerville, TX (US); Karl I. Hamand, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 150 days.

(21) Appl. No.: 12/465,312

(22) Filed: May 13, 2009

(65) Prior Publication Data
US 2009/0284907 A1    Nov. 19, 2009

Related U.S. Application Data

(60) Provisional application No. 61/054,096, filed on May 16, 2008.

(51) Int. Cl.
*G06F 1/16* (2006.01)
(52) U.S. Cl. .............. 361/727; 361/679.33; 361/679.39; 361/724; 312/223.1; 312/223.2
(58) Field of Classification Search ............ 361/679.39, 361/727
See application file for complete search history.

(56) References Cited

U.S. PATENT DOCUMENTS

| | | | | |
|---|---|---|---|---|
| 4,710,853 | A * | 12/1987 | Reinhardt | 361/727 |
| 6,288,902 | B1 * | 9/2001 | Kim et al. | 361/725 |
| 6,392,892 | B1 * | 5/2002 | Sobolewski et al. | 361/724 |
| 6,552,915 | B2 * | 4/2003 | Takahashi et al. | 361/796 |
| 6,804,877 | B2 * | 10/2004 | Mueller et al. | 29/603.03 |
| 6,862,173 | B1 * | 3/2005 | Konshak et al. | 361/679.33 |
| 7,154,757 | B1 * | 12/2006 | Pavol et al. | 361/740 |
| 7,423,870 | B2 | 9/2008 | Carlisi et al. | 361/686 |
| 7,525,796 | B2 * | 4/2009 | Chih et al. | 361/679.33 |
| 7,619,897 | B2 * | 11/2009 | Della Fiora et al. | 361/724 |
| 2003/0063431 | A1 * | 4/2003 | Sobolewski | 361/600 |
| 2005/0157464 | A1 * | 7/2005 | McAlister | 361/685 |
| 2007/0127204 | A1 * | 6/2007 | Muenzer et al. | 361/685 |
| 2009/0040710 | A1 * | 2/2009 | Chung | 361/684 |
| 2009/0147459 | A1 * | 6/2009 | Nguyen et al. | 361/679.31 |

* cited by examiner

*Primary Examiner* — Jinhee Lee
*Assistant Examiner* — Anthony Q Edwards
(74) *Attorney, Agent, or Firm* — Baker Botts L.L.P.

(57) ABSTRACT

A system includes a plurality of modular information handling systems, a chassis configured to house the plurality of modular information handling systems, a chassis support structure coupled to the chassis, and a modular system support structure coupled to a particular modular information handling system. The modular system support structure is configured to interact with the chassis support structure to support the particular modular information handling system in the chassis in a suspended manner.

19 Claims, 8 Drawing Sheets

METHOD AND APPARATUS FOR MOUNTING SERVER BLADES IN A BLADE CHASSIS

RELATED APPLICATION

This application claims the benefit of U.S. provisional patent application No. 61/054,096 filed May 16, 2008, entitled "METHOD AND APPARATUS FOR MOUNTING SERVER BLADES IN A BLADE CHASSIS."

TECHNICAL FIELD

The present disclosure relates in general to blade servers, and more particularly to a method and apparatus for mounting server blades in a blade server chassis.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

One type of information handling system is a blade server, or simply "blade." Blades are often self-contained information handling systems designed specifically to allow the placement of multiple blades in a single enclosure or aggregation of enclosures. A blade enclosure or chassis may hold multiple blades and provide services to the various blades such as power, cooling, networking, interconnects, and management. For example, the chassis may include a plurality of power supply units configured to provide power to blades mounted in the chassis.

One type of information handling system is a modular information handling system which may also be referred to as a blade server, a brick server, a modular enclosure, or a modular storage system. Modular information handling systems typically contain a midplane for interconnecting multiple modular components such as modular driver carriers or blades. The midplane and modular components are typically stored in a chassis with a front opening that allows for installation and removal of the modular components minimizing the installation and removal operations. Some modular information handling systems allow modular components (e.g., blades) to be installed or removed while the system is operating which is often referred to as a "hot-swap."

FIG. 1 shows a front view of an example chassis 10 of a prior art blade server 10, having no blades installed therein. Chassis 10 is divided by vertical walls 12 into four generally vertical compartments 1-4 for receiving server blades. Each compartment 1-4 may include four "bays"—two lower bays and two upper bays—for receiving up to four blades, depending on the size or form factor of such blades. To illustrate, compartment 1 includes 4 bays, indicated as bays A, B, C, and D in FIG. 1.

For example, chassis 10 may support four different blade form factors:
1. Single-High Single-Wide (SHSW) (occupies 1 bay)
2. Single-High Double-Wide (SHDW) (occupies 2 horizontally adjacent bays)
3. Double-High Single-Wide (DHSW) (occupies 2 vertically adjacent bays)
4. Double-High Double-Wide (DHDW) (occupies 4 bays)

A single compartment may receive:
(a) 1 Double-High Double-Wide blade; or
(b) 2 Double-High Single-Wide blades located side by side; or
(c) 2 Single-High Double-Wide blades located one above the other; or
(d) 4 Single-High Single-Wide blades with two on the bottom side-by-side and two located above the bottom two.

Removable mid-floor support structures 14 are used in order to insert blades in upper bays (e.g., bays A and B shown in FIG. 1). FIG. 1 shows mid-floor support structures 14 located in each of compartments 1-4.

FIG. 2 illustrates an example configuration of prior art chassis 10 with different-sized blades inserted therein.

Compartment 1 includes four Single-High Single-Wide blades 20A, with a mid-floor support structure 14 used to support the top two blades.

Compartment 3 includes two Single-High Single-Wide blades 20A on bottom and a Single-High Double-Wide blade 20B on top, with a mid-floor support structure 14 used to support the Single-High Double-Wide blade 20B.

Compartment 4 includes a single Double-High Double-Wide blade 20C.

Compartment 2 includes a Single-High Single-Wide blade 20A and a Double-High Single-Wide blade 20D positioned side-to-side. With this configuration, another Single-High Single-Wide blade cannot be inserted above the lower Single-High Single-Wide blade 20A because a mid-floor support structure 14 for supporting another Single-High Single-Wide blade cannot be inserted in compartment 2 (due to the presence of the Double-High Single-Wide blade). Thus, one of the upper bays of compartment 2, indicated at 22, is unusable.

Thus, such traditional blade server configurations do not maximize blade connectivity, as certain bays of the chassis may remain unused. In addition, blade blanks intended to prevent airflow recirculation cannot be installed securely as they also latch into the removable mid-floor.

SUMMARY

In accordance with the teachings of the present disclosure, disadvantages and problems associated with traditional blade server chassis have been substantially reduced or eliminated.

In general, a blade server chassis of the present disclosure includes a blade-mounting system that eliminates certain problems of traditional chassis described above. Blades (e.g., SHSW and/or SHDW blades) positioned in the upper bays in the chassis may be suspended by one or more rails or other similar hanging-support structure and do not require a mid-floor support structure for support. This blade-suspension system allows a SHSW or SHDW blade to be installed in the upper bays of the chassis regardless of what is installed below them. In addition, the blade-suspension system may allow full customer flexibility and blade connectivity regardless of which blade types are installed in which chassis compartments. If a Double-High Single-Wide blade is installed in Compartment 1, a Single-High Single-Wide blade can be installed in the upper bay adjacent to it with no issues.

In addition, in some embodiments, blade blank modules may employ the same rail or other support structure such that blade blanks may similarly be suspended in upper bays of the chassis.

According to one aspect of certain embodiments, a system includes a plurality of modular information handling systems, a chassis configured to house the plurality of modular information handling systems, a chassis support structure coupled to the chassis, and a modular system support structure coupled to a particular modular information handling system. The modular system support structure is configured to interact with the chassis support structure to support the particular modular information handling system in the chassis in a suspended manner.

According to another aspect of certain embodiments, a chassis configured to house a plurality of modular information handling systems is provided. A chassis support structure is coupled to the chassis and configured to interact with a module system support structure associated with a particular modular information handling system in order to support the particular modular information handling system in the chassis in a suspended manner.

According to another aspect of certain embodiments, a modular information handling system configured to be inserted in a chassis is provided. A modular system support structure is coupled to the modular information handling system and configured to interact with a chassis support structure associated with the chassis in order to support the modular information handling system in the chassis in a suspended manner.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 3-9, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

In the present disclosure, for example, the term "information handling system" may refer to a single server blade, a blade server including a chassis and multiple server blades, and/or a larger system including a blade server and any other systems or components (e.g., a network, other servers, host devices, etc.).

Figure 3:
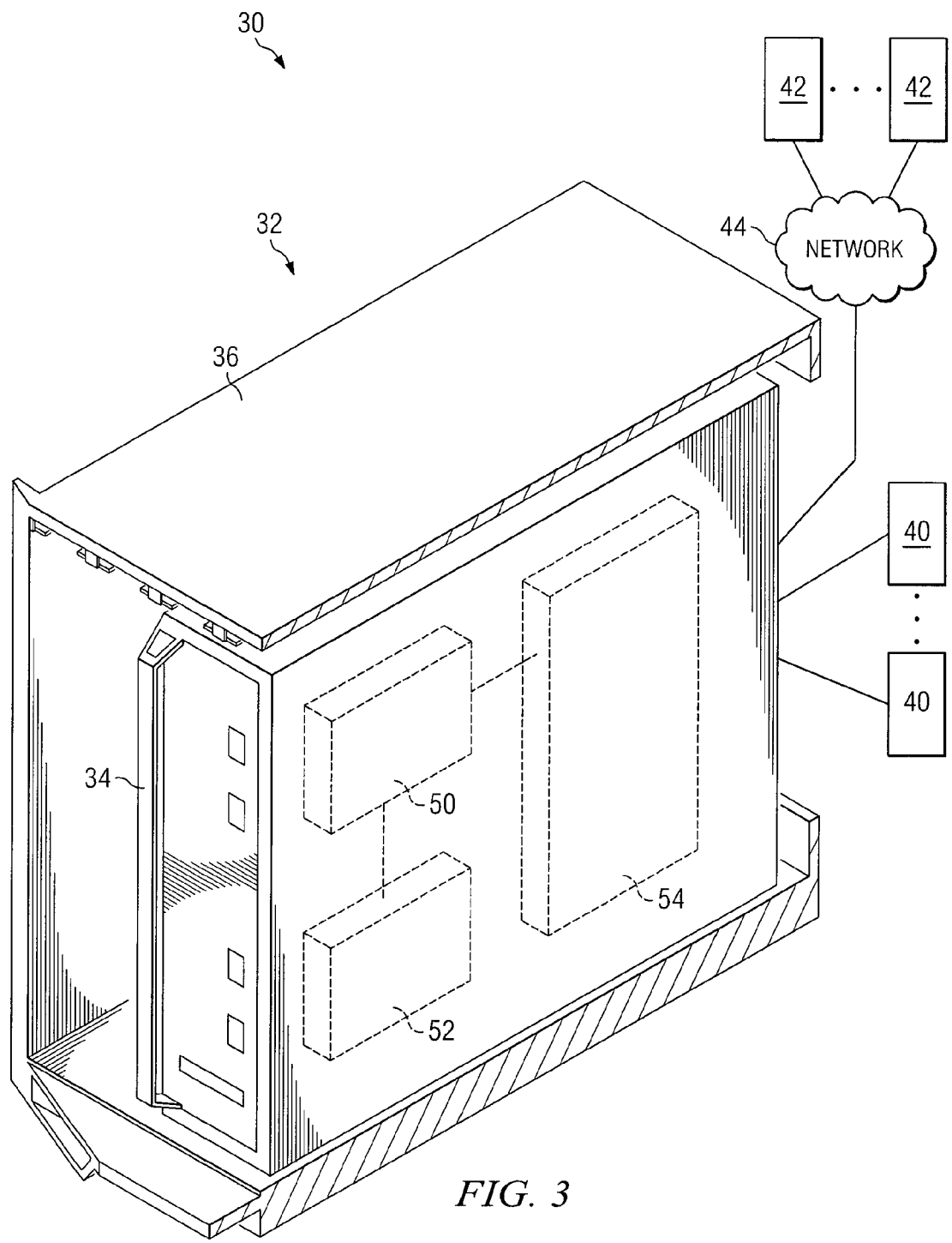
FIG. 3 illustrates an example information handling system including a blade server having a chassis including a blade-suspension system, according to certain embodiments of the present disclosure.

FIG. 3 illustrates an example information handling system 30 including a blade server 32 having one or more blades 34 housed in a blade server chassis 36, according to certain embodiments of the present disclosure. System 30 may include any number of local nodes 40 connected to blade server 32 by any suitable wireless or wireline connection. In addition or alternatively, system 30 may include any number of remote nodes 42 connected to blade server 32 by a network 44.

Local and remote nodes 40 and 42 may comprise any types of information handling systems, e.g., servers, hosts, desktop computers, terminals, mobile devices, etc.

Network 44 may include any network and/or fabric configured to communicatively couple various devices in system 30. For example, network 44 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet, or any other appropriate architecture or system that facilitates the communication of signals, data and/or messages (generally referred to as data).

A blade 34 may include a processor 50, a memory 52 communicatively coupled to processor 50, and storage resources 54 communicatively coupled to processor 50 and memory 52. Each blade may also include one or more user interfaces.

Processor 50 may comprise any system, device, or apparatus operable to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 50 may interpret and/or execute program instructions and/or process data stored in memory 52, storage resource 54, and/or another component of blade 34.

Memory 52 may be communicatively coupled to processor 50 and may comprise any system, device, or apparatus operable to retain program instructions or data for a period of time (e.g., computer-readable media). Memory 52 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to blade 34 is turned off.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory, as well as communications media such wires, optical fibers, microwaves, radio waves, and other electromagnetic and/or optical carriers; and/or any combination of the foregoing.

Figure 1:
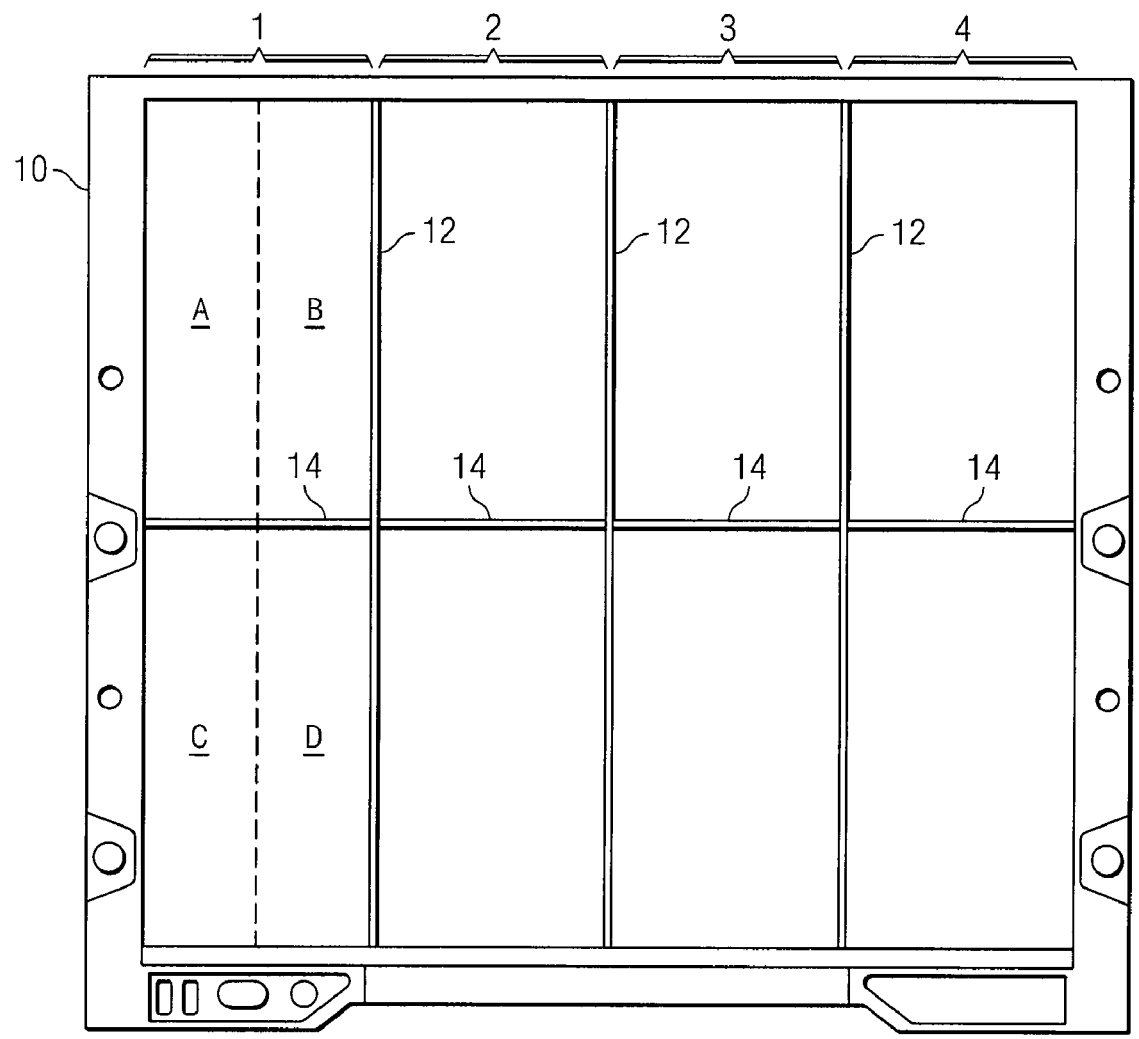
FIG. 1 illustrates an example blade server chassis including removable mid-floor support structures for supporting one or more server blades, shown with no blades inserted in the chassis, according to a prior art system.
Figure 2:
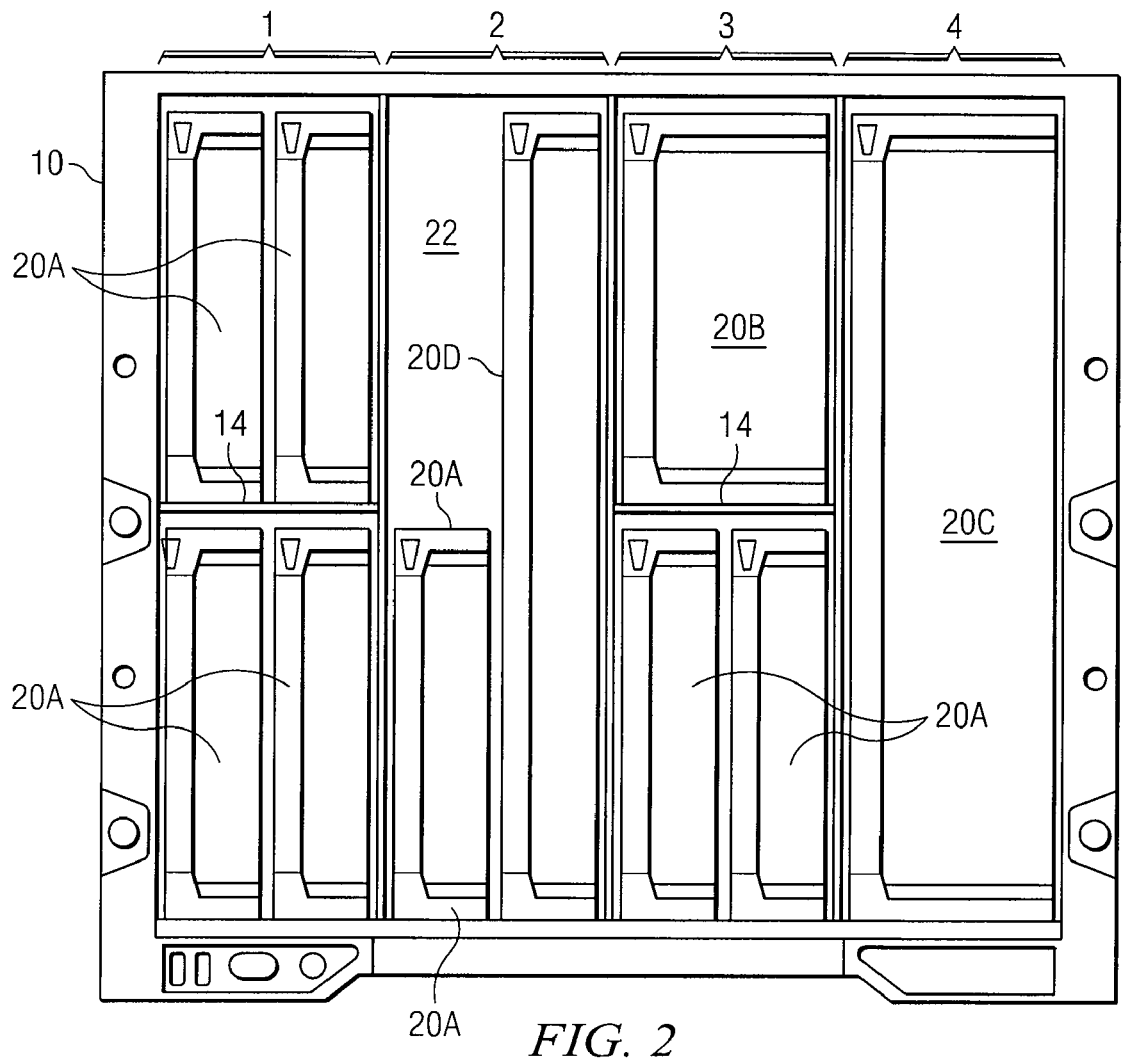
FIG. 2 illustrates the example blade server chassis of FIG. 1, shown with removable mid-floor support structures disposed in certain compartments for supporting blades in such compartments, according to a prior art system.

Blades 34 may also include "blanks," which are blank modules that may be installed (or in some embodiments, must be installed) where no actual blade 34 is installed in a blade compartment or a portion of a blade compartment (e.g., compartment portion 22 shown in prior art FIG. 2).

Chassis 36 of blade server 32 may be configured to house multiple blades 34. Similar to traditional systems, chassis 36 may be divided into multiple compartments, each having one or more bays (e.g., 4 bays) configured to house one or more blades 34 (e.g., up to 4 blades). However, in contrast with traditional systems, chassis 36 includes a blade-suspension system 60 (see FIGS. 4-8) configured to support one or more blades 34 from the top and/or sides of blades 34. Thus, blades 34 (e.g., SHSW and/or SHDW blades, or blade blanks) may be inserted and supported in the upper bays of chassis compartments without needing mid-floor support structures to support such blades. Such configuration may eliminate or reduce unusable space in the chassis.

Figure 4:
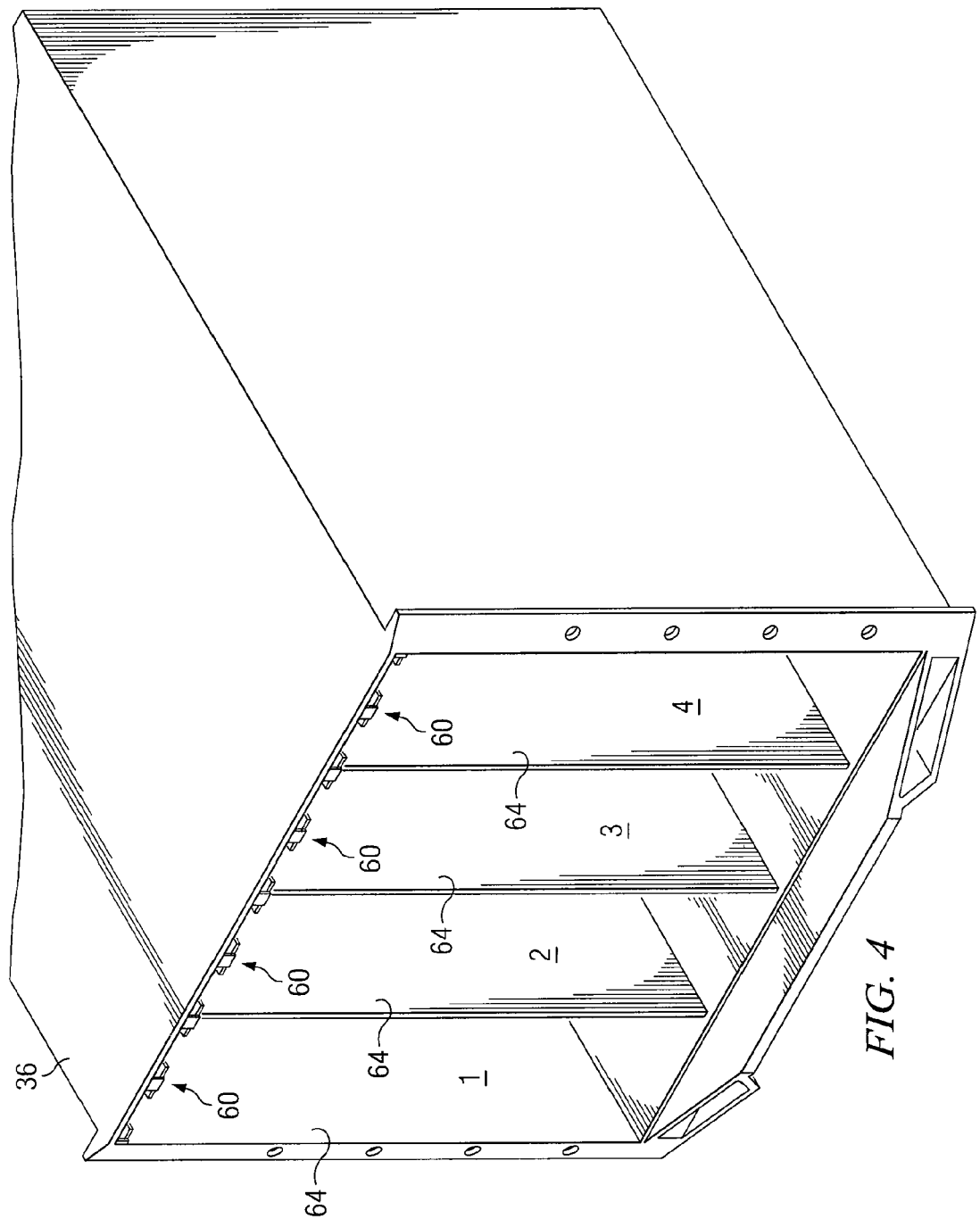
FIG. 4 illustrates a three-dimensional view of an example blade server chassis having a blade-suspension system, for use in the information handling system of FIG. 3, according to certain embodiments of the present disclosure.

FIG. 4 illustrates a three-dimensional view of an example blade server chassis 36 for use in the information handling system of FIG. 3, according to certain embodiments of the present disclosure. Chassis 36 may be divided by vertical walls 64 into generally vertical compartments 1-4 for receiving server blades. Each compartment 1-4 may include four "bays"—two lower bays and two upper bays—for receiving up to four blades, depending on the size or form factor of such blades. For example, chassis 36 may house four different blade form factors:

1. Single-High Single-Wide (SHSW) (occupies 1 bay)
2. Single-High Double-Wide (SHDW) (occupies 2 horizontally adjacent bays)
3. Double-High Single-Wide (DHSW) (occupies 2 vertically adjacent bays)
4. Double-High Double-Wide (DHDW) (occupies 4 bays)

A single compartment may house:
(a) 1 Double-High Double-Wide blade; or
(b) 2 Double-High Single-Wide blades located side by side; or
(c) 2 Single-High Double-Wide blades located one above the other; or
(d) 4 Single-High Single-Wide blades with two on the bottom side-by-side and two located above the bottom two.

Although the example chassis 36 includes four compartments, each having four bays for housing up to four blades 34, it should be understood that other embodiments of chassis 36 may be divided into any suitable number of compartments and bays suitable to house any suitable number of blades 34.

As discussed above, blade server chassis 36 may also include a blade-suspension system 60 configured to support one or more blades 34 from the top and/or sides of blades 34. The details of blade-suspension system 60 are discussed in more detail with reference to FIGS. 7A, 7B, and 8.

Figure 5:
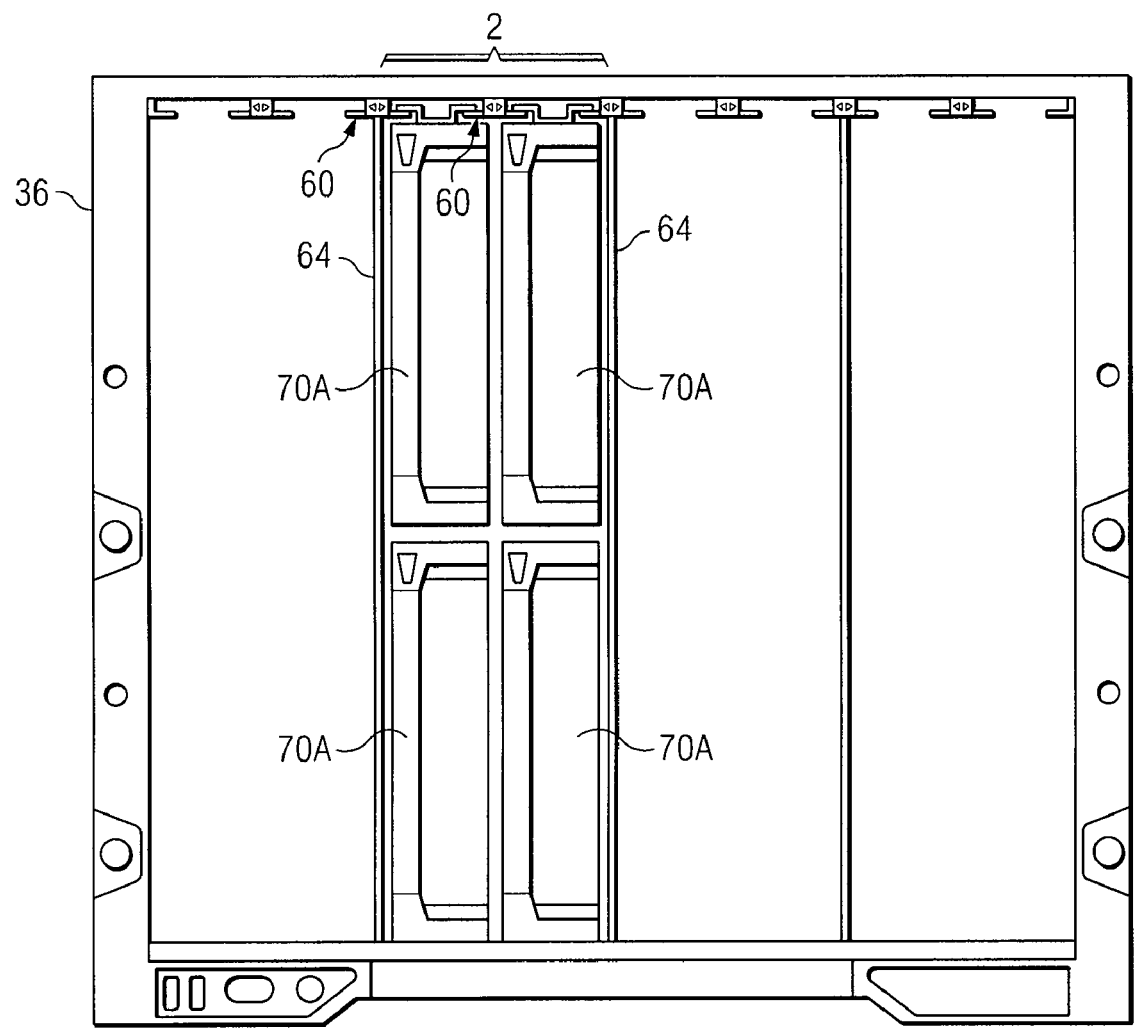
FIG. 5 illustrates a front view of the example blade server chassis of FIG. 4, according to certain embodiments of the present disclosure.

FIG. 5 illustrates a front view of the blade server chassis 36 of FIG. 4, according to certain embodiments of the present disclosure. In particular, FIG. 5 shows four Single-High Single-Wide (SHSW) blades 70A inserted in compartment 2 of chassis 36, two inserted in lower bays and two inserted in upper bays of compartment 2. The two SHSW blades 70A inserted in the upper bays may be supported by blade-suspension system 60, which may include any suitable system of rails or other supporting elements for supporting blades 70A. Thus, the top two blades 70A may be suspended from the top portion of chassis 36. Additionally or alternatively, blade-suspension system 60 may include rails or other support structures coupled to or integrated in one or both of the walls 64 that define compartment 2, for supporting blades 70A in a suspended manner.

Each blade 34 (or at least certain blades 34, e.g., SHSW, SHDW, and blanks) may include structures for interacting with blade-suspension system 60. For example, blades 34 may include rails or other structures coupled to or formed on top and/or side surfaces of the blades 34 and configured to interact with various components of blade-suspension system 60.

The details of blade-suspension system 60 and corresponding structures of blades 34 are discussed in more detail with reference to FIGS. 7A, 7B, and 8. As discussed above, with blade-suspension system 60, mid-floor support structures are not needed for supporting blades 34 in the upper bays.

Figure 6:
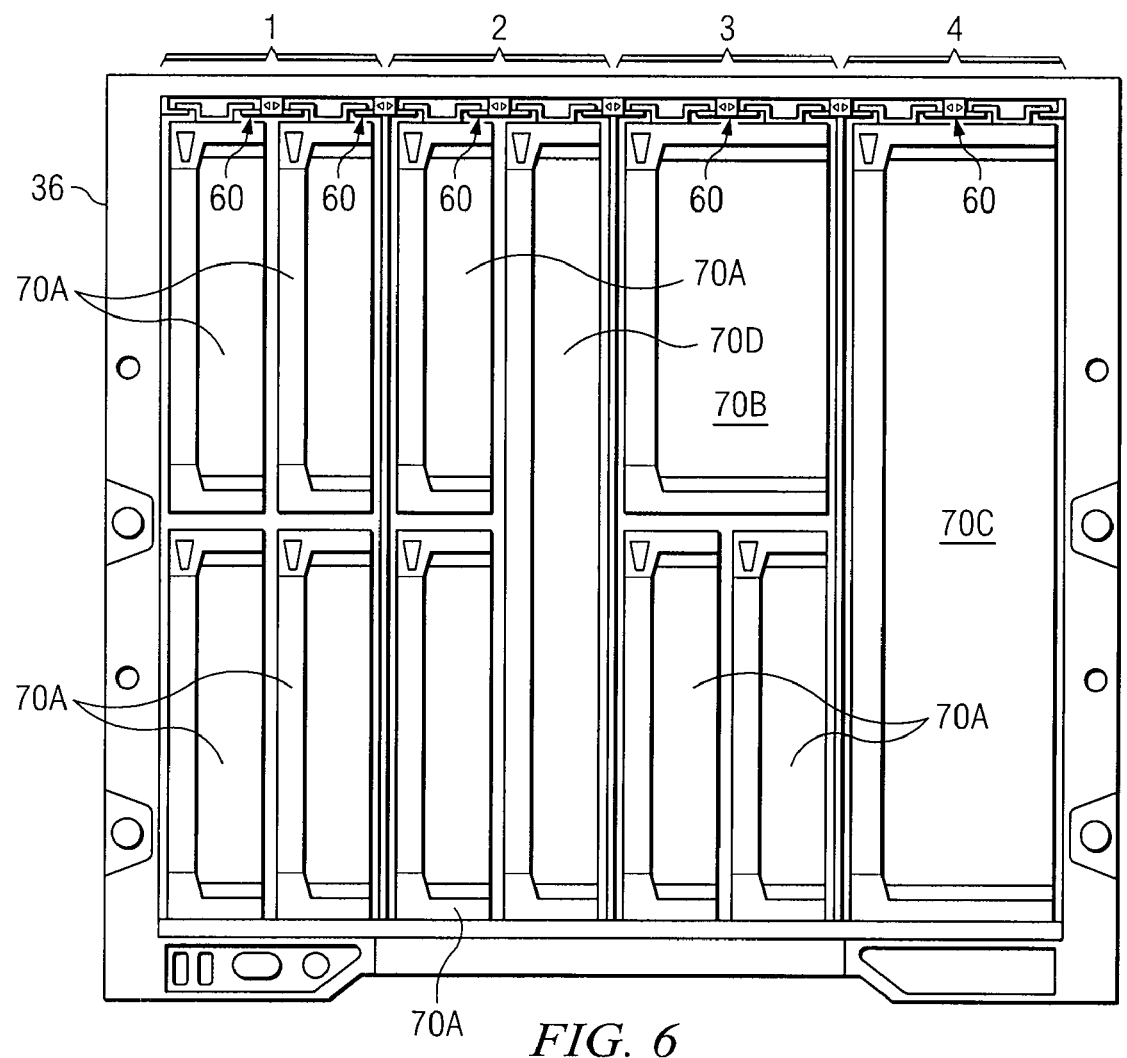
FIG. 6 illustrates another view of the example blade server chassis of FIG. 5, showing the use of the blade suspension system for managing the storage of different sized blades in the chassis, according to certain embodiments of the present disclosure.

FIG. 6 illustrates another view of the example blade server chassis 36 of FIG. 5, showing the use of the blade-suspension system 60 for managing the storage of different sized blades 34, according to certain embodiments of the present disclosure.

As shown in FIG. 6, compartment 1 includes four Single-High Single-Wide blades 70A, with the two in the upper bays being suspended by blade-suspension system 60.

Compartment 2 includes a Double-High Single-Wide blade 70D and two Single-High Single-Wide blades 70A, with the Single-High Single-Wide blade in the upper bay being suspended by blade-suspension system 60.

Compartment 3 includes two Single-High Single-Wide blades 70A in the lower bays, and a Single-High Double-Wide blade 70B filling the upper two bays and suspended by blade-suspension system 60.

Compartment 4 includes a single Double-High Double-Wide blade 70C.

Server blades 70A suspended in chassis 36 by blade-suspension system 60 may be include actual server blades, blade blanks, or any combination thereof.

Figure 7A:
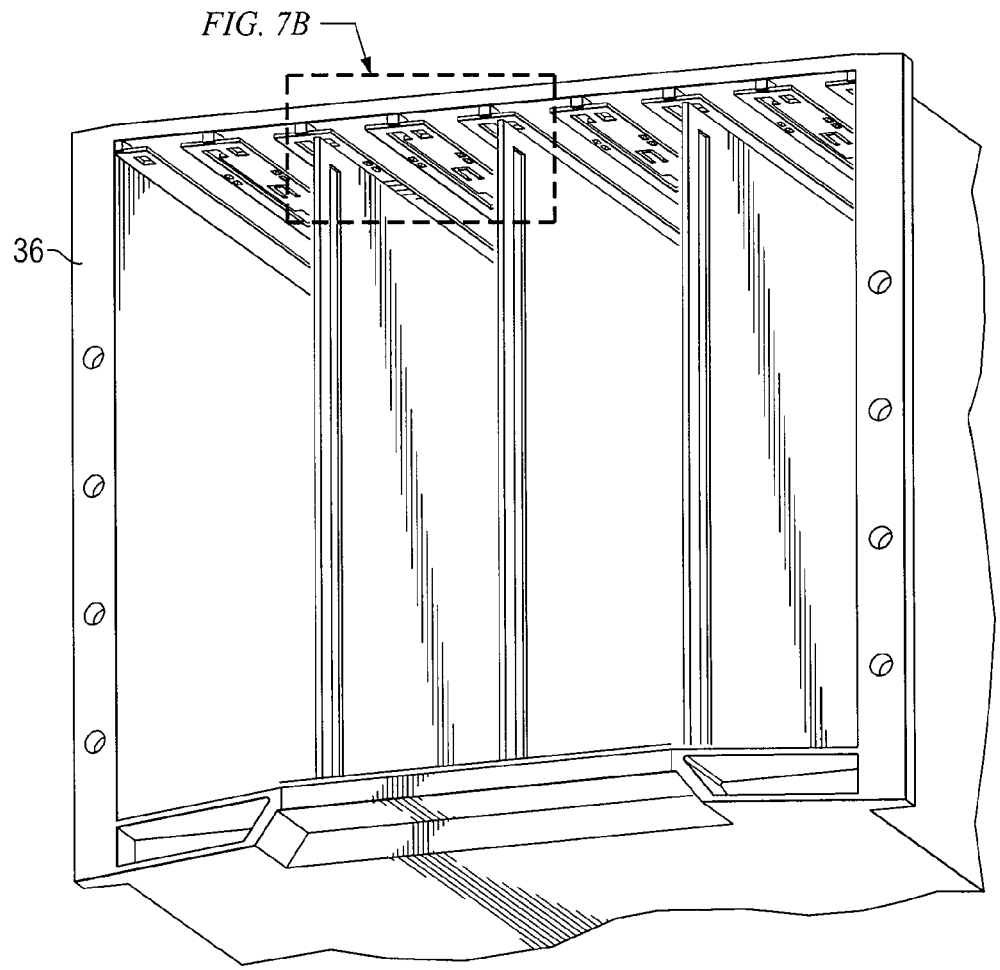
FIGS. 7A and 7B illustrate a three-dimensional view and a larger, blown-up view, of portions of an example blade-suspension system for suspending a server blade in a chassis, according to certain embodiments of the present disclosure.
Figure 7B:
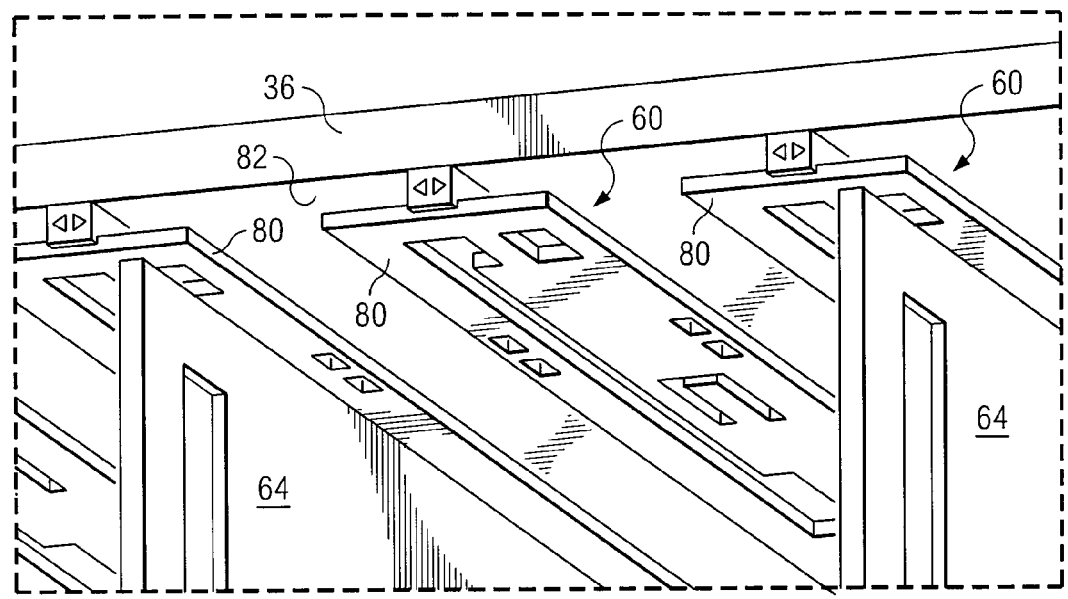

FIGS. 7A and 7B illustrates a three-dimensional view and a larger, blown-up view, of portions of an example blade-suspension system 60 of chassis 36, according to certain embodiments of the present disclosure. Blade-suspension system 60 includes a number of chassis support structures 80 coupled to a top wall 82 of chassis 36. In this example, chassis support structures 80 form rails that interact with corresponding structures of blades 34 (e.g., blade support structures 90 discussed below with reference to FIGS. 8 and 9) for supporting blades 34 in a suspended manner. In other embodiments, chassis support structures 80 may include any other suitable structures that may interact with corresponding structures of blades 34 to suspended blades 34. For example, chassis support structures 80 may include hooks, slots, detents, protrusions, ledges, shelves, ridges, depressions, clips, buttons, magnets, and/or any other suitable structures.

Chassis support structures 80 may be coupled to wall 82 and/or other portions of chassis 36 in any suitable manner, e.g., with screws, bolts, clips, or other mechanical fasteners, with an adhesive, or by welding. In some embodiments, chassis support structures 80 may be removable. In other embodiments, chassis support structures 80 may be formed integrally with wall 82 or other structures of chassis 36.

In some embodiments, blade-suspension system 60 may include a number of chassis support structures 80 coupled to or formed on one or more side walls 64 of chassis 36. Such wall structures 80 may be used instead of, or in addition to, chassis support structures 80 coupled to or formed on top wall 82 of chassis 36.

Figure 8:
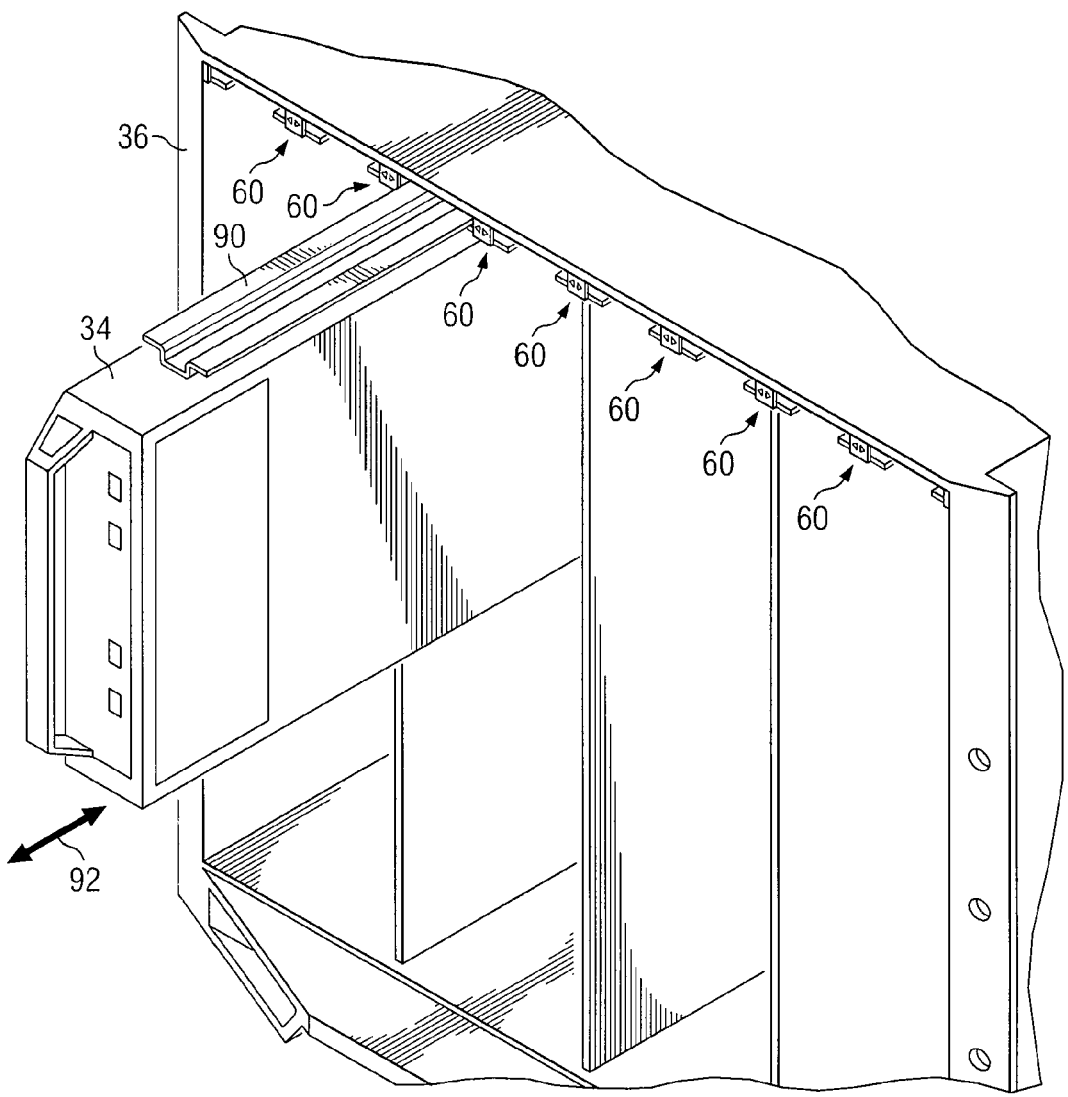
FIG. 8 illustrates a three-dimensional view of a server blade being inserted into an upper bay of a blade server chassis, according to certain embodiments of the present disclosure.

FIG. 8 illustrates a three-dimensional view of a blade 34 being inserted into an upper bay of chassis 36 for support by blade-suspension system 60, according to certain embodiments of the present disclosure.

Blade 34 includes a number of blade support structures 90 coupled to a top wall 82 of chassis 36. In this example, blade support structures 90 form rails that interact with chassis support structures 80 of chassis 36 to support blades 34 in a suspended manner. In other embodiments, blade support structures 90 may include any other suitable structures that may interact with chassis support structures 80 to suspended blades 34. For example, blade support structures 90 may include hooks, slots, detents, protrusions, ledges, shelves, ridges, depressions, clips, buttons, magnets, and/or any other suitable structures.

Blade support structures 90 may be coupled to top and/or side walls of blades 34 in any suitable manner, e.g., with screws, bolts, clips, or other mechanical fasteners, with an adhesive, or by welding. In some embodiments, blade support structures 90 may be removable. In other embodiments, blade support structures 90 may be formed integrally with blades 34.

As indicated by arrow 92 in FIG. 8, blade 34 may be slid in and out of chassis 36, with blade support structures 90 interacting with chassis support structures 80 to suspend blade 34. In some embodiments, after insertion, blade 34 may be locked or secured in place using a locking or securing device.

Server blade 34 shown in FIG. 8 may include any suitable blade device, e.g., an actual server blade or a blade blank.

Figure 9:
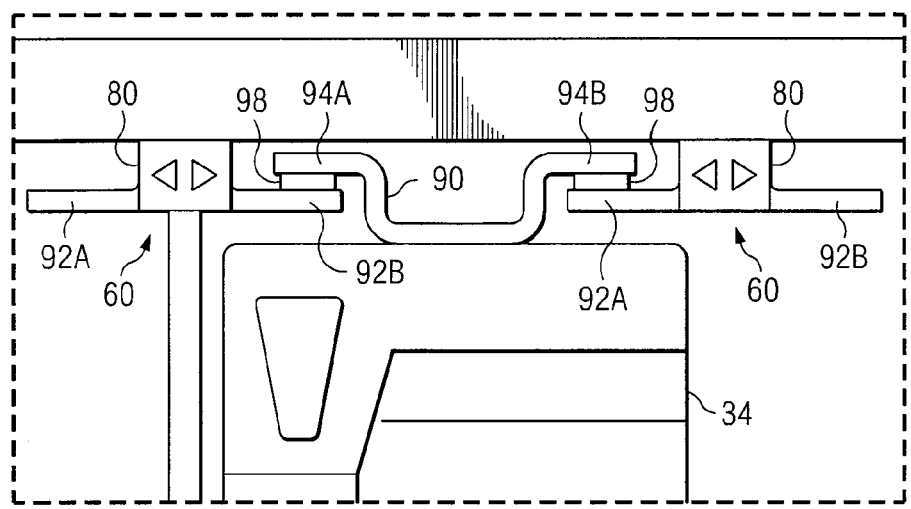
FIG. 9 illustrates a sectional front view of an inserted server blade suspended by a blade-suspension system, according to certain embodiments of the present disclosure.

FIG. 9 illustrates a sectional front view of an inserted blade 34 suspended by blade-suspension system 60, according to certain embodiments of the present disclosure.

In this particular example, each chassis support structure 80 forms a pair of rails—a left rail 92A and a right rail 92B. The blade support structure 90 for a particular blade 34 forms a pair of rails 94A and 94B configured to rest on the right rail 92B from a first chassis support structure 80 and the left rail 92A from a second, adjacent chassis support structure 80. As shown in FIG. 9, cushions or damping elements 98 (e.g., rubber or plastic pads) may be coupled to blade support structure 90 and/or chassis support structure 80 to provide vibration and/or noise damping between blade 34 and chassis 36.

It should be understood that the structures shown in FIGS. 7A, 7B, 8 and 9 are examples only, and that any other suitable structures and configurations may be similarly used in order to suspend blades 34 from chassis 36.

Although the present disclosure has been described in detail, it should be understood that various changes, substitutions, and alterations can be made hereto without departing from the spirit and the scope of the invention as defined by the appended claims.

What is claimed is:

1. A system, including:
a chassis configured to house a plurality of modular information handling systems, the chassis having at least one compartment for receiving one or more modular information handling systems, the at least one compartment having a top, a bottom, and at least one wall;
a chassis support structure coupled to the at least one wall; and
a modular system support structure coupled to a particular modular information handling system, the modular system support structure configured to interact with the chassis support structure to support the particular modular information handling system from the top of the at least one compartment in a suspended manner such that the at least one compartment may receive another modular information handling system at the bottom of the at least one compartment.

2. A system according to claim 1, wherein:
the system comprises a blade server;
chassis comprises a blade server chassis; and
the plurality of modular information handling systems comprises a plurality of server blades configured to be inserted in the blade server chassis.

3. A system according to claim 1, wherein:
the chassis support structure comprises one or more first rails; and
the modular system support structure comprises one or more second rails configured to interact with the one or more first rails to support the particular modular information handling system in the chassis in a suspended manner.

4. A system according to claim 1, wherein:
the chassis defines a plurality of upper bays and lower bays for receiving the modular information handling systems;
the chassis support structure and the modular system support structure interact to suspend the particular modular information handling system in an upper bay in the chassis.

5. A system according to claim 4, wherein another modular information handling is located in a lower bay in the chassis directly below the suspended particular modular information handling system.

6. A system according to claim 1, wherein:
the plurality of modular information handling systems comprises a plurality of server blades having different form factors;
the particular modular information handling system comprises a first single-high single-wide server blade;
the chassis includes a compartment including two upper bays and two lower bays configured to receive various combinations of server blades having different form factors, including:
a first double-high single-wide server blade located in one upper bay and one lower bay in the compartment;
the first single-high single-wide server blade suspended in the other upper bay in the compartment; and
a second single-high single-wide server blade located in the other lower bay in the compartment.

7. A system according to claim 1, wherein the particular modular information handling system is supported in the chassis in a suspended manner without being supported from below.

8. A system according to claim 1, wherein at least one of the chassis support structure and the modular system support structure is formed integrally with the chassis and the particular modular information handling system, respectively.

9. A chassis configured to house a plurality of modular information handling systems, the chassis comprising:
at least one compartment for receiving one or more modular information handling systems, the at least one compartment having a top, a bottom, and at least one wall;
a chassis support structure coupled to the at least one wall, the chassis support structure configured to interact with a module system support structure associated with a particular modular information handling system in order to support the particular modular information handling system in the chassis in a suspended manner from the top of the at least one compartment such that the at least one compartment may receive another modular information handling system at the bottom of the at least one compartment.

10. A chassis according to claim 9, wherein the chassis support structure comprises one or more first rails configured to interact with one or more first rails of the module system support structure to support the particular modular information handling system in the chassis in a suspended manner.

11. A chassis according to claim 9, wherein:
the chassis defines a plurality of upper bays and lower bays for receiving the modular information handling systems; and
the chassis support structure interacts with the modular system support structure to suspend the particular modular information handling system in an upper bay in the chassis.

12. A chassis according to claim 11, wherein another modular information handling is located in a lower bay in the chassis directly below the suspended particular modular information handling system.

13. A chassis according to claim 9, wherein:
the plurality of modular information handling systems comprises a plurality of server blades having different form factors;
the particular modular information handling system comprises a first single-high single-wide server blade; and
the chassis includes a compartment including two upper bays and two lower bays configured to receive various combinations of server blades having different form factors, including:
a first double-high single-wide server blade located in one upper bay and one lower bay in the compartment;
the first single-high single-wide server blade suspended in the other upper bay in the compartment; and
a second single-high single-wide server blade located in the other lower bay in the compartment.

14. A chassis according to claim 9, wherein the chassis support structure is formed integrally with the chassis.

15. A chassis according to claim 9, wherein the chassis support structure is configured to interact with the modular system support structure to the particular modular information handling system in a suspended manner without being supported from below.

16. A modular information handling system configured to be inserted in a chassis having at least one compartment for receiving one or more modular information handling systems, the at least one compartment having a top, a bottom, and at least one wall, the modular information handling system comprising:
a modular system support structure coupled to the modular information handling system, the modular system support structure configured to interact with a chassis support structure associated with the at least one wall of the chassis in order to support the modular information handling system in the chassis in a suspended manner from the top of the at least one compartment such that the at least one compartment may receive another modular information handling system at the bottom of the at least one compartment.

17. A modular information handling system according to claim 16, wherein the modular system support structure comprises one or more first rails configured to interact with one or more first rails of the chassis support structure to support the modular information handling system in the chassis in a suspended manner.

18. A modular information handling system according to claim 16, wherein the modular system support structure is configured to interact with the chassis support structure to support the modular information handling system in an upper bay of the chassis.

19. A modular information handling system according to claim 16, wherein the modular system support structure is configured to interact with the chassis support structure to support the modular information handling system in a suspended manner without being supported from below.

* * * * *